US012125716B2

(12) United States Patent
Gong et al.

(10) Patent No.: US 12,125,716 B2
(45) Date of Patent: Oct. 22, 2024

(54) SEMICONDUCTOR DEVICE PACKAGING WARPAGE CONTROL

(71) Applicant: NXP USA, INC., Austin, TX (US)

(72) Inventors: Zhiwei Gong, Chandler, AZ (US);
Scott M. Hayes, Chandler, AZ (US);
Michael B. Vincent, Chandler, AZ (US); Vivek Gupta, Phoenix, AZ (US);
Richard Te Gan, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 30 days.

(21) Appl. No.: 17/337,583

(22) Filed: Jun. 3, 2021

(65) Prior Publication Data
US 2022/0392777 A1   Dec. 8, 2022

(51) Int. Cl.
| H01L 21/56 | (2006.01) |
| H01L 21/66 | (2006.01) |
| H01L 21/67 | (2006.01) |
| H01L 23/00 | (2006.01) |
| H01L 23/31 | (2006.01) |

(52) U.S. Cl.
CPC ...... *H01L 21/561* (2013.01); *H01L 21/67126* (2013.01); *H01L 22/26* (2013.01); *H01L 23/3121* (2013.01); *H01L 23/3157* (2013.01); *H01L 24/94* (2013.01); *H01L 21/568* (2013.01)

(58) Field of Classification Search
CPC . H01L 21/561; H01L 21/67126; H01L 22/26; H01L 23/3121
See application file for complete search history.

(56) References Cited

U.S. PATENT DOCUMENTS

| 7,950,144 B2 | 5/2011 | Ramanathan et al. |
| 8,758,552 B2 | 6/2014 | Canale et al. |
| 8,829,661 B2 | 9/2014 | Lytle et al. |
| 8,832,924 B2 | 9/2014 | Mizumata |
| 9,107,303 B2 | 8/2015 | Lytle et al. |
| 9,420,694 B2 | 8/2016 | Chung |
| 9,786,520 B2 | 10/2017 | Liu et al. |
| 2006/0131746 A1 | 6/2006 | Kohara et al. |

(Continued)

FOREIGN PATENT DOCUMENTS

| DE | 69931994-D1 | * | 1/2007 |
| JP | S62149141 A | | 7/1987 |

(Continued)

OTHER PUBLICATIONS

Notice of Allowance dated May 2, 2023 in U.S. Appl. No. 17/230,098.

(Continued)

*Primary Examiner* — Mohammad M Choudhry
(74) *Attorney, Agent, or Firm* — Robert J. Amedeo

(57) ABSTRACT

A method of manufacturing a packaged semiconductor device is provided. The method includes placing a plurality of semiconductor die on a carrier substrate. The plurality of semiconductor die and an exposed portion of the carrier substrate are encapsulated with an encapsulant. A cooling fixture includes a plurality of nozzles and is placed over the encapsulant. The encapsulant is cooled by way of air exiting (Continued)

the plurality of nozzles. A property of air exiting a first nozzle of the plurality of nozzles is different from that of a second nozzle of the plurality of nozzles.

16 Claims, 11 Drawing Sheets

(56) References Cited

U.S. PATENT DOCUMENTS

| | | | |
|---|---|---|---|
| 2009/0047754 | A1 | 2/2009 | Chen et al. |
| 2009/0261468 | A1 | 10/2009 | Kroeninger et al. |
| 2009/0289339 | A1 | 11/2009 | Hu et al. |
| 2011/0193237 | A1* | 8/2011 | Tian ............... H01L 23/3107 257/773 |
| 2012/0139192 | A1 | 6/2012 | Ooi |
| 2012/0171875 | A1 | 7/2012 | Gan et al. |
| 2013/0181336 | A1* | 7/2013 | Talbot ............... H01L 24/19 438/122 |
| 2014/0077381 | A1 | 3/2014 | Lin et al. |
| 2015/0371969 | A1 | 12/2015 | Yu et al. |
| 2016/0056055 | A1 | 2/2016 | Ko et al. |
| 2016/0351462 | A1 | 12/2016 | Kuan et al. |
| 2017/0133358 | A1 | 5/2017 | Chang et al. |
| 2017/0338129 | A1 | 11/2017 | Lin |
| 2018/0350710 | A1 | 12/2018 | Iwahashi et al. |
| 2019/0341356 | A1 | 11/2019 | Chung et al. |
| 2019/0364691 | A1* | 11/2019 | Subrahmanyam ........................... H05K 7/20518 |
| 2020/0066655 | A1 | 2/2020 | Eid et al. |
| 2021/0384043 | A1 | 12/2021 | Fay et al. |
| 2022/0193858 | A1* | 6/2022 | Deshpande ......... H01L 21/7684 |

FOREIGN PATENT DOCUMENTS

| | | |
|---|---|---|
| JP | 2015079832 A | 4/2015 |
| WO | 2008018379 A1 | 2/2008 |

OTHER PUBLICATIONS

U.S. Appl. No. 18/358,195, filed Jul. 25, 2023, entitled "Semiconductor Device Packaging Warpage Control".
Notice of Allowance dated Apr. 19, 2022 in U.S. Appl. No. 17/209,710.
Baozong, Z., "FEA Simulation and In-situ Warpage Monitoring of Laminated Package Molded with Green EMC Using Shadow Morie System", 2006 7th International Conference on Electronic Packaging Technology, Aug. 26-29, 2006.
Che, F.X., "Study on Warpage of Fan-Out Panel Level Packaging (FO-PLP) using Gen-3 Panel", 2019 IEEE 69th Electronic Components and Technology Conference (ECTC), May 28-31, 2019.
Lau, J., "Recent Advances and Trends in Fan-Out Wafer/Panel-Level Packaging", Journal of Electronic Packaging, vol. 141, Dec. 2019.
U.S. Appl. No. 17/209,710, filed Mar. 23, 2021, and entitled "Semiconductor Device Packaging Warpage Control".
U.S. Appl. No. 17/230,098, filed Apr. 14, 2021, and entitled "Semiconductor Device Packaging Warpage Control".

* cited by examiner

SEMICONDUCTOR DEVICE PACKAGING WARPAGE CONTROL

BACKGROUND

Field

This disclosure relates generally to semiconductor device packaging, and more specifically, to semiconductor device packaging warpage control.

Related Art

Today, many electronic products include semiconductor devices formed from wafer-level and strip-level packaging of semiconductor die. With wafer-level and strip-level packaging, connections to the semiconductor die may be formed after encapsulation. After encapsulation, there is a problem referred to as warping that can occur as an effect of the encapsulation, redistribution, or other process steps, for example. Warping is of particular concern in wafer-level and strip-level packaging as forming connections to the semiconductor die can be difficult thus affecting yield, reliability, costs, and handling through processing. Therefore, it is desirable to overcome problems associated with wafer-level and strip-level warpage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device packaging apparatus for controlling warpage. A cooling fixture includes a plurality of nozzles configured to systematically cool an encapsulated semiconductor device assembly. A control unit coupled to the cooling fixture controls properties such as fluid flow rate, fluid temperature, and duration of fluid exiting the nozzles. The fluid (e.g., air, gas, vapor, liquid) exiting the nozzles may be controlled for each individual nozzle or for predetermined groups of nozzles. A desired flatness of the encapsulated assembly is achieved by way of the cooling fixture and controlled fluid delivery process. With the desired flatness, subsequent planar-sensitive processing layers may be applied allowing for improved yield, reliability, costs, and handling through processing.

Figure 1A:
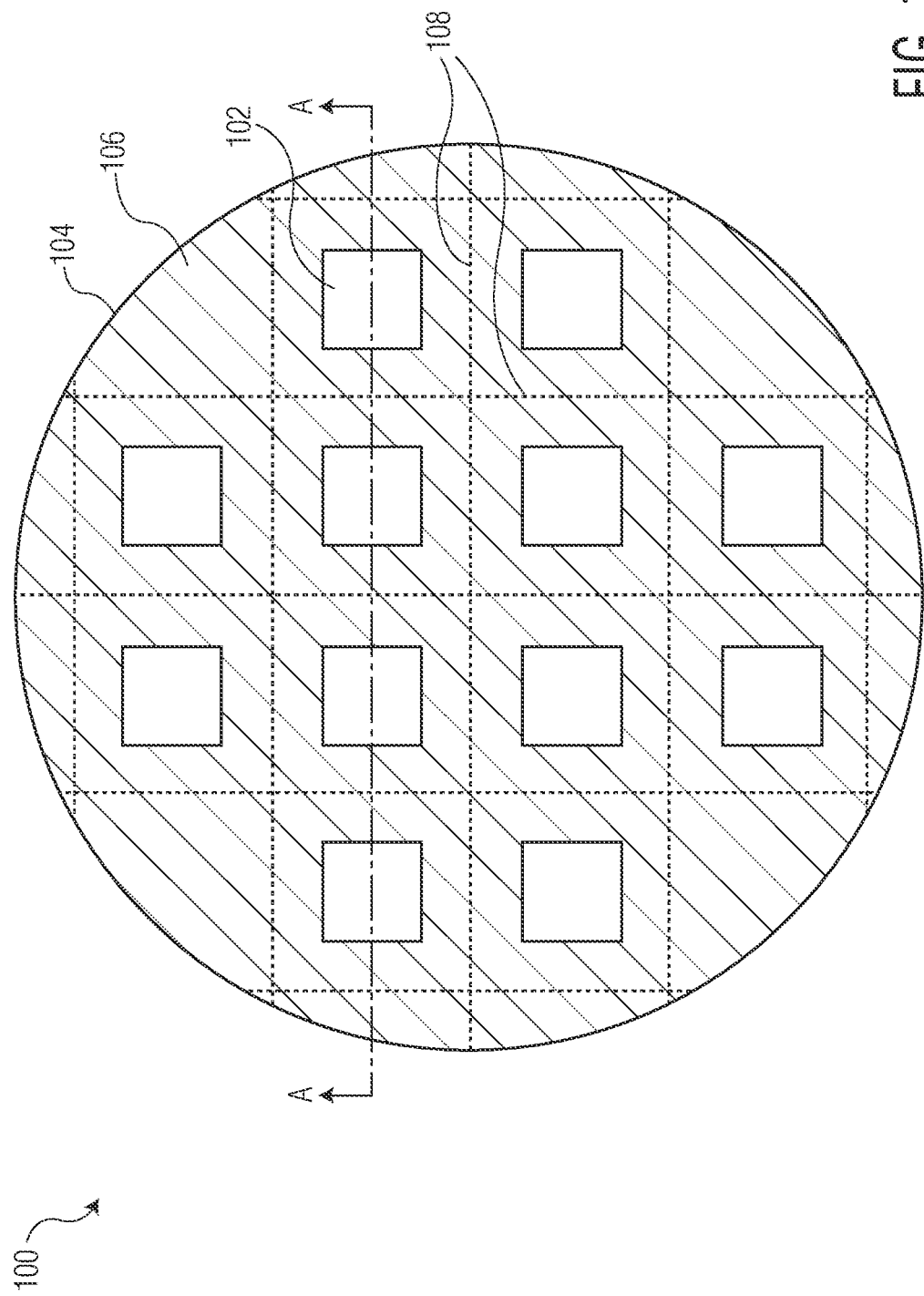
FIG. 1A illustrates, in a simplified plan view, an example semiconductor device packaging at a stage of manufacture in accordance with an embodiment.

FIG. 1A illustrates, in a simplified plan view, an example semiconductor device packaging 100 at a stage of manufacture in accordance with an embodiment. At this stage of manufacture, the packaging 100 includes a plurality of semiconductor die 102 placed on a carrier substrate 104. In this embodiment, each package site includes at least one semiconductor die 102 of the plurality. The package sites are depicted by way of predetermined singulation lanes 108 shown as dashed lines. In this embodiment, the packaging 100 is depicted in a round form factor having 12 package sites, for example. In other embodiments, the packaging 100 may include any number of package sites and may be formed in other form factor shapes (e.g., rectangular). Cross-sectional views of examples of the semiconductor device packaging 100 taken along line A-A at stages of manufacture are depicted in FIG. 2 through FIG. 5 and FIG. 7 through FIG. 10.

The semiconductor die 102 has an active side (e.g., major side having circuitry) and a backside (e.g., major side opposite of the active side). The semiconductor die 102 includes bond pads (not shown) at the active side configured for connection to printed circuit board (PCB) by way of redistribution layer (RDL), for example. The semiconductor die 102 may be formed from any suitable semiconductor material, such as silicon, germanium, gallium arsenide, gallium nitride and the like. The semiconductor die 102 may further include any digital circuits, analog circuits, RF circuits, memory, signal processor, MEMS, sensors, the like, and combinations thereof. In addition to the semiconductor die 102, other components, devices, and/or structures may be included in the package sites such as discrete devices, embedded substrates, copper structures (e.g., embedded ground plane), and the like.

The carrier substrate 104 has a top major side and a bottom major side. The carrier substrate 104 is configured and arranged to provide a temporary structure for placement of semiconductor die 102 and encapsulation at a subsequent stage of manufacture. The carrier substrate 104 may be formed from any suitable material such as glass, metal, silicon wafer, ceramic, or organic material. The carrier substrate 104 may be formed as a multilayer laminate (e.g., PCB material) structure or other layered material structure. The carrier substrate 104 may be formed in any suitable shape such as round, square, or rectangular. An adhesive layer 106 (e.g., double-sided tape, film) is applied to the top side of the carrier substrate for temporary die attachment and subsequent encapsulation. In this embodiment, the semiconductor die 102 of the plurality are placed active surface down onto the top side of the carrier substrate 104. In some embodiments, sensor elements may be incorporated into the carrier substrate 104.

Figure 1B:
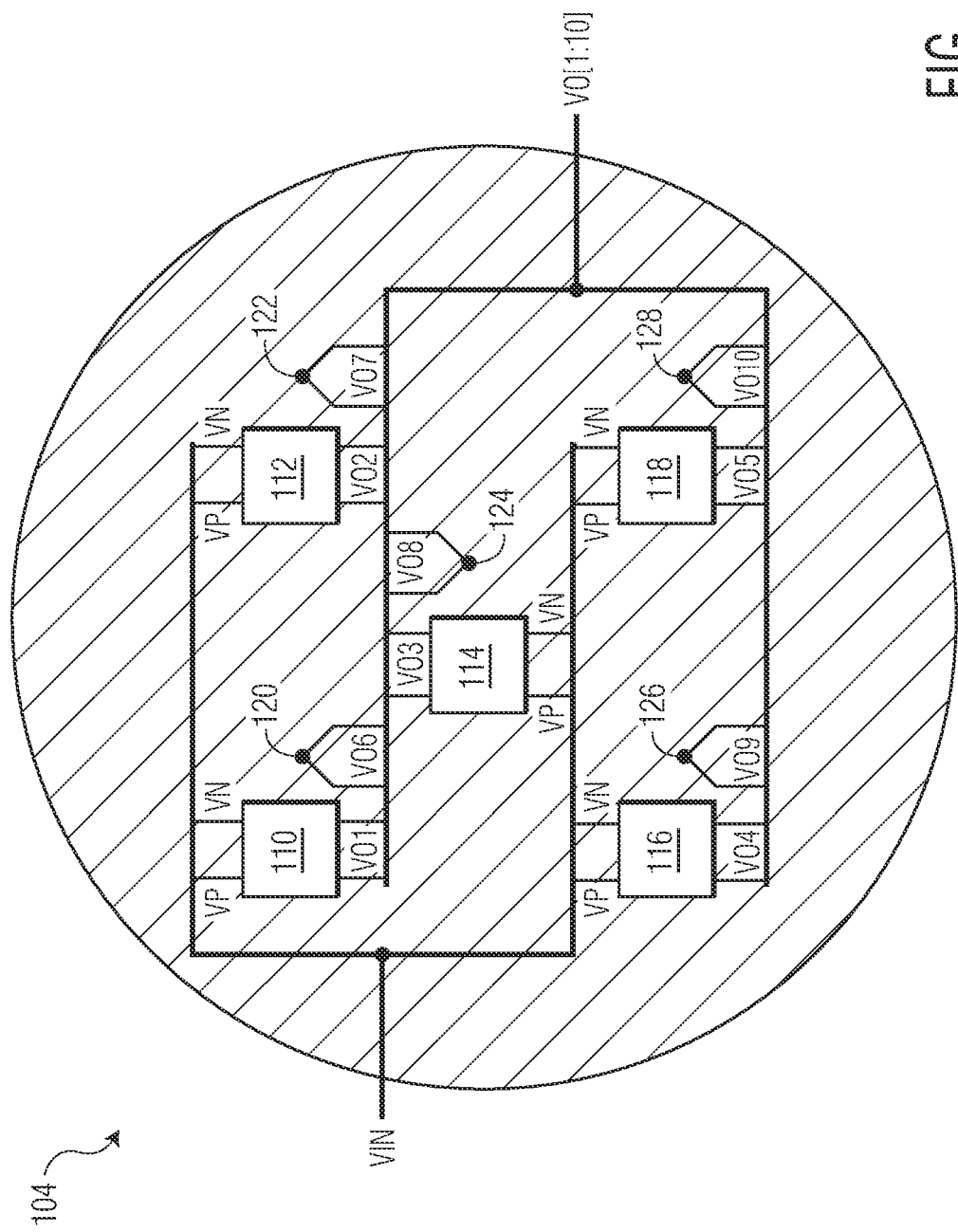
FIG. 1B illustrates, in a simplified schematic view, an example carrier substrate having sensor elements in accordance with an embodiment.

FIG. 1B illustrates, in a simplified schematic view, an example carrier substrate 104 having sensor elements in accordance with an embodiment. In this embodiment, sensor elements 110-128 are integrated with the carrier substrate 104. The sensor elements 110-128 may be formed in flexible film layer applied at the top side of the carrier substrate 104, for example. In this embodiment, the sensor elements 110-118 are characterized as strain gauge elements and the sensor elements 120-128 are characterized as thermocouple elements. Each of the sensor elements 110-118 is configured for receiving a reference voltage VIN by way of voltage signal lines VP and VN, and in turn, providing an independent output voltage (e.g., VO[1:5]) indicative of strain sensed at the carrier substrate 104. Likewise, each of the sensor elements 120-128 is configured for providing an independent output voltage (e.g., VO[6:10]) indicative of temperatures sensed at the carrier substrate 104. The type, number, and location of sensor elements depicted in FIG. 1B are chosen for illustrative purposes. Embodiments of the carrier substrate 104 may include any suitable number of sensor elements.

In the embodiment depicted in FIG. 1B, the carrier substrate 104 is formed having a substantially round shape. The sensor elements 110-128 are integrated or otherwise attached in predetermined regions of the carrier substrate 104. For example, considering a Cartesian coordinate perspective, the sensor elements 114 and 124 are located at the center (e.g., origin), the sensor elements 112 and 122 are located at quadrant I, the sensor elements 110 and 120 are located at quadrant II, the sensor elements 116 and 126 are located at quadrant III, and the sensor elements 118 and 128 are located at quadrant IV. In other embodiments, other desired numbers of sensor elements and locations thereof may be incorporated in the carrier substrate 104.

Figure 2:
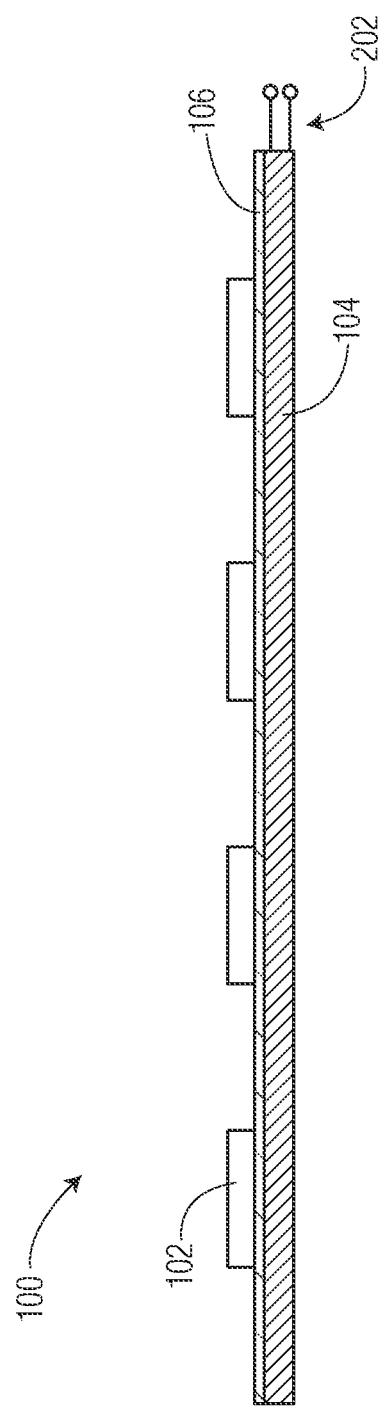
FIG. 2 illustrates, in a simplified cross-sectional view, the example semiconductor device packaging at a stage of manufacture in accordance with an embodiment.

FIG. 2 illustrates, in a simplified cross-sectional view, the example semiconductor device packaging 100 at the stage of manufacture depicted in FIG. 1B in accordance with an embodiment. At this stage of manufacture, the packaging 100 includes the plurality of semiconductor die 102 placed on the adhesive layer 106 applied to the top side of the carrier substrate 104. In this embodiment, the semiconductor die 102 of the plurality are placed active surface down onto the top side of the carrier substrate 104. In this embodiment, the sensor elements 110-128 (not shown) integrated with the carrier substrate 104 are coupled to example terminals 202 for external electrical connection to the sensor elements.

Figure 3:
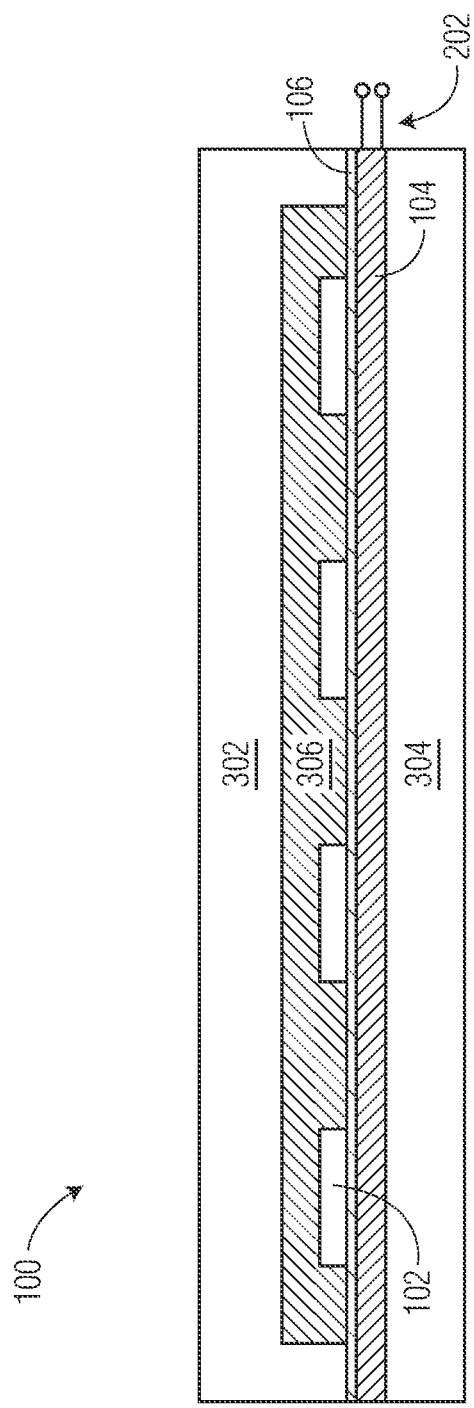
FIG. 3 through FIG. 5 illustrate, in simplified cross-sectional views, the example semiconductor device packaging at subsequent stages of manufacture in accordance with an embodiment.

FIG. 3 illustrates, in a simplified cross-sectional view, the example semiconductor device packaging 100 at a subsequent stage of manufacture in accordance with an embodiment. At this stage of manufacture, the packaging 100 further includes an encapsulant (e.g., epoxy material) 306 which encapsulates the plurality of semiconductor die 102 and portion of the top side of the carrier substrate 104 forming an encapsulated assembly. The term encapsulated assembly, as used herein, refers to the encapsulated plurality of semiconductor die 102 consistent with wafer-level and strip-level packaging, for example. In this embodiment, the carrier substrate 104 with the plurality of semiconductor die 102 is placed in a molding fixture 302 and 304 and encapsulated with the encapsulant 306.

Figure 4:
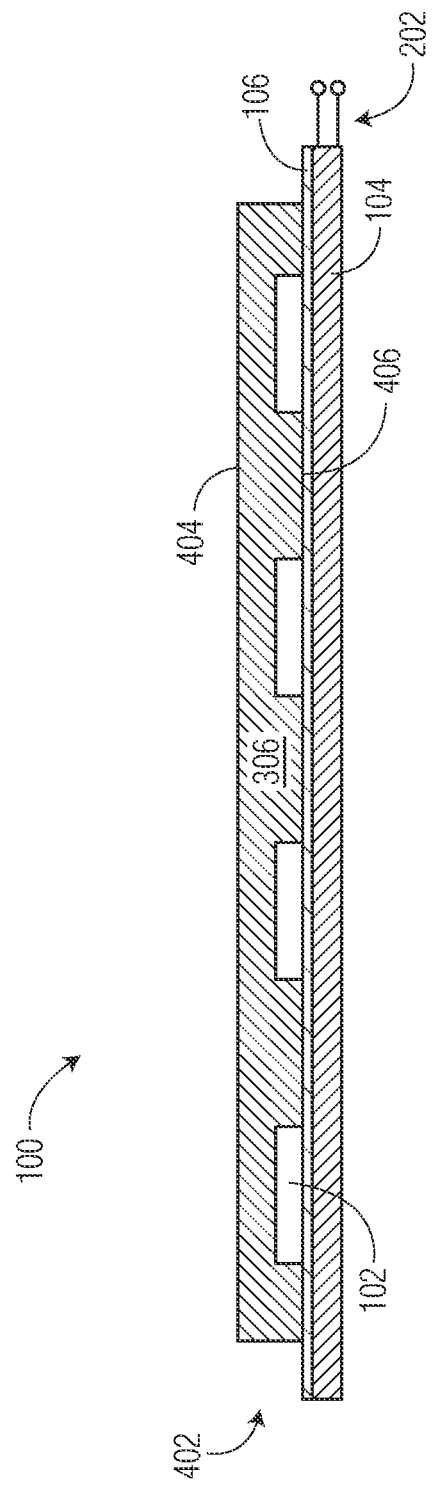

FIG. 4 illustrates, in a simplified cross-sectional view, the example semiconductor device packaging 100 at a subsequent stage of manufacture in accordance with an embodiment. At this stage of manufacture, the encapsulated assembly 402 along with the carrier substrate 104 are removed from the molding fixture and at a subsequent stage, timely moved to a cooling station. In this embodiment, the encapsulant 306 is at or near a cure temperature for the encapsulant material. In this embodiment, the encapsulated assembly 402 includes a first major surface 404 and a second major surface 406 opposite of the first major surface. The second major surface 406 may also be referred to as an active surface of the encapsulant 306 including the active side of the semiconductor die 102 being in substantially the same plane as the encapsulant's second major surface. Accordingly, the first major surface 404 may also be referred to as a non-active surface of the encapsulant 306.

Figure 5:
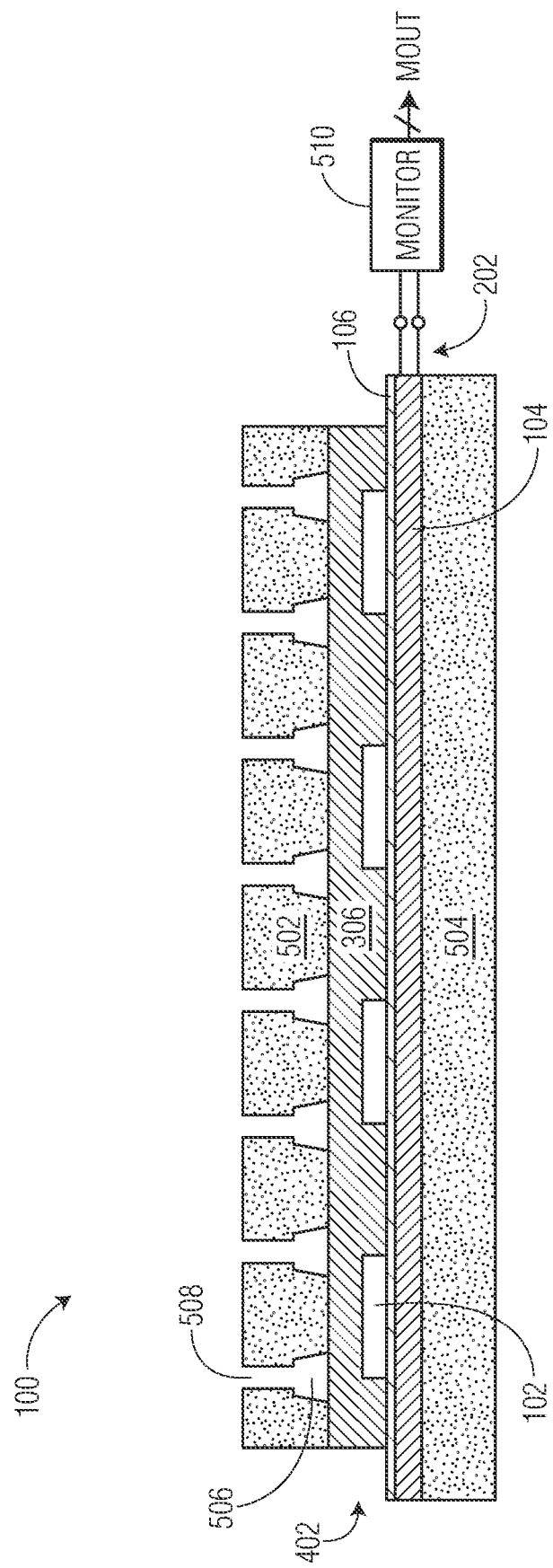

FIG. 5 illustrates, in a simplified cross-sectional view, the example semiconductor device packaging 100 at a subsequent stage of manufacture in accordance with an embodiment. At this stage of manufacture, a cooling fixture 502 is placed over the encapsulant 306 of the encapsulated assembly 402 while the encapsulant 306 is at an elevated temperature (e.g., generally greater than 100° C.). The cooling fixture 502 includes a plurality of nozzles 506 having respective inlets 508. Each nozzle of the plurality of nozzles 506 is configured to cool a region of the encapsulant 306 proximate to the nozzle and based on fluid (e.g., air, gas, vapor, liquid) exiting the nozzle. For discussion purposes, it is presumed that properties (e.g., fluid flow rate, fluid temperature, duration) of fluid exiting each nozzle 506 are substantially similar to that of the fluid delivered at each respective inlet 508. The plurality of nozzles may be arranged in predetermined groups of nozzles such that each group of nozzles may be configured to cool a respective unique region of the encapsulant 306. In this embodiment, the cooling fixture 502 further includes a companion base fixture 504 configured to support the carrier substrate 104 with the encapsulated assembly 402. The cooling fixture 502 may be clamped or otherwise attached over the encapsulant 306 of the encapsulated assembly 402 such that the encapsulated assembly 402 is held in a substantially planar condition while the encapsulant 306 is cooled.

In this embodiment, sensors (e.g., sensor elements 110-128 of FIG. 1B) included with the carrier substrate 104 may be coupled to an external monitor unit 510 by way of the terminals 202. The monitor unit 510 may include circuitry configured for providing suitable sensor reference voltages (e.g., VIN for strain gauge elements 110-118, FIG. 1B) and circuitry configured for amplifying sensor output signals (e.g., VO[6-10] for thermocouple elements 120-128, FIG. 1B). For example, thermocouple output signals are generally small voltage signals that may require amplification in the process of converting the outputs signals into temperature readings. The monitor unit 510 may further include circuitry such as an analog-to-digital converter configured for converting sensor analog output signals (e.g., VO[1-10] for sensor elements 110-128, FIG. 1B) to digital output signals. In this embodiment, the monitor unit 510 includes outputs for providing output signals MOUT based on the sensor output signals. The MOUT signals may be useful for providing feedback (e.g., to a controller) such as an indication of planarity and regional temperatures of the encapsulated assembly 402 during cooling, for example.

Figure 6:
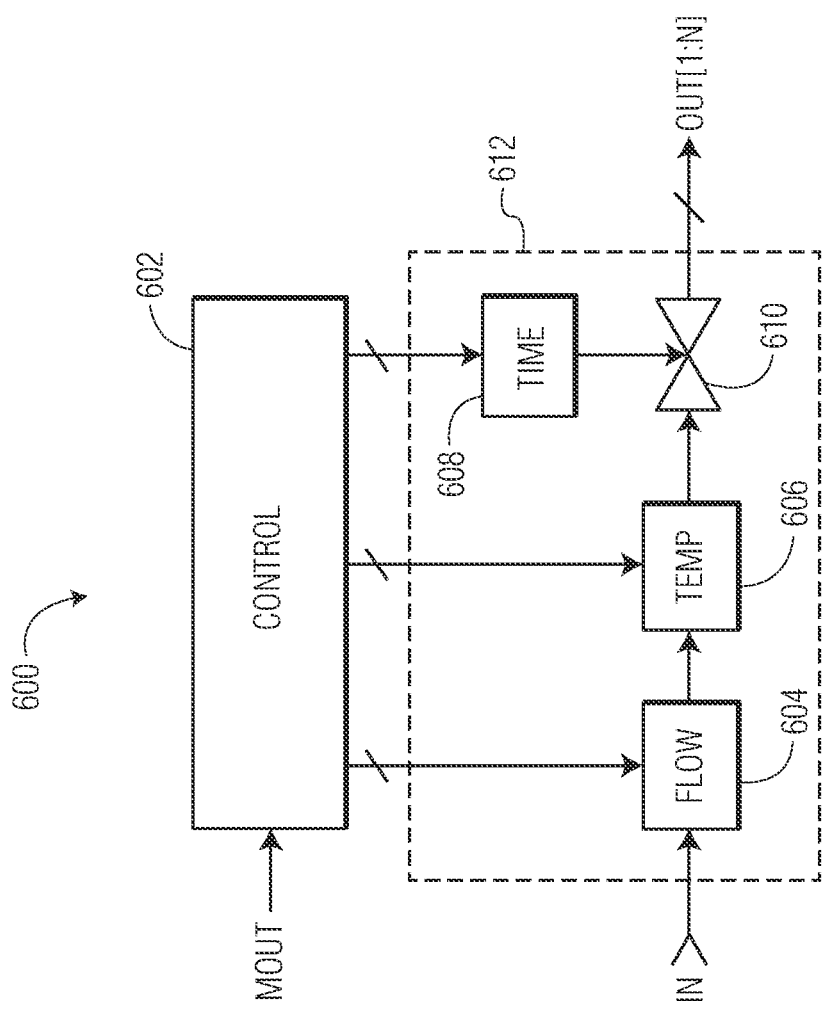
FIG. 6 illustrates, in a simplified block diagram view, an example fluid delivery control system in accordance with an embodiment.

FIG. 6 illustrates, in a simplified block diagram view, an example fluid delivery control system 600 in accordance with an embodiment. In this embodiment, the control system 600 includes a controller unit 602 coupled to a plurality of fluid delivery control channels 612. The controller unit 602 includes functional blocks such as a processing unit (e.g., finite state machine, CPU), memory, and a timer, for example. The controller unit 602 further includes inputs for receiving monitored sensor output signals MOUT and outputs for providing control signals to the control channels 612. For discussion purposes, it is presumed that air is the fluid used in the descriptions of FIG. 6 through FIG. 8. For example, each of the control channels 612 includes a flow unit 604, a temperature unit 606, a time unit 608, and a valve 610 coupled to provide air delivery at an individual output OUT[1:N], where N is the number of control channels 612.

The flow unit 604 controls the volume and rate of the air provided to the respective inlets 508 of the cooling fixture 502. The flow unit 604 includes an input coupled to receive input air and in turn, provides at an output a predetermined output air flow (e.g., 0.1-0.5 CFM). The air composition may include any suitable inert gas (e.g., nitrogen) or mixture of gases (e.g., ambient air). The temperature unit 606 controls the temperature of the air provided to the respective inlets 508 of the cooling fixture 502. The temperature unit 606 includes an input coupled to receive the predetermined air flow from the flow unit 604 and in turn, provides at an output a predetermined temperature conditioned (e.g., 10-30° C.) output air flow. The time unit 608 controls when the valve 610 is open and closed based on a predetermined duration (e.g., ~30 seconds to ~2 minutes) or sequence of desired air delivery to the respective inlets 508 of the cooling fixture 502. The valve 610 includes an input coupled to receive the temperature conditioned output air flow from the temperature unit 606 and in turn, provides timed temperature conditioned air flow at the individual output OUT[1:N].

In this embodiment, the control system 600 is programmable and configured for controlling one or more properties (e.g., air flow rate, air temperature, duration) as well as a sequence of the air exiting each nozzle or group of nozzles of the cooling fixture 502. For example, a first group of nozzles coupled to receive air delivered from output OUT[1] may have a property different than that of a second group of nozzles coupled to receive air delivered from output OUT[2]. The cooling system may be further configured for adjusting the one or more properties based on the monitored sensor output signals MOUT, for example.

Figure 7:
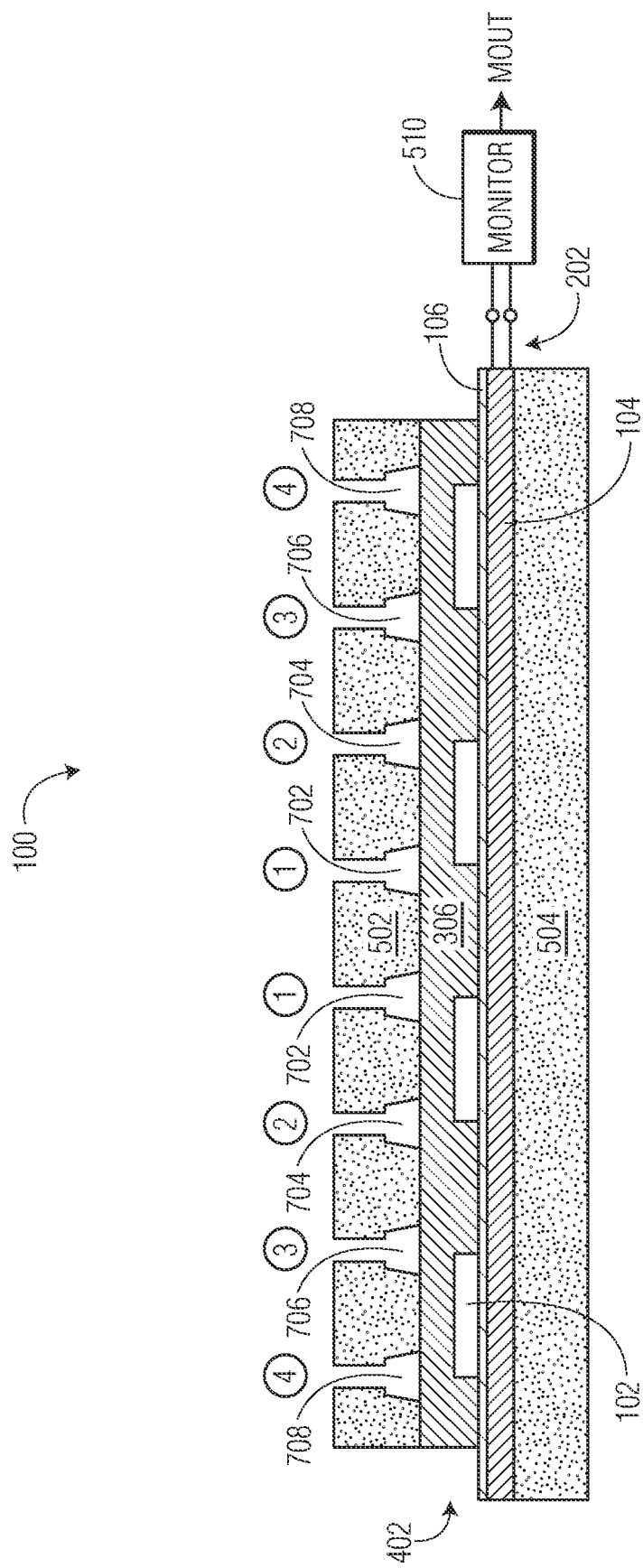
FIG. 7 and FIG. 8 illustrate, in simplified cross-sectional views, example air delivery control methods in accordance with an embodiment.

FIG. 7 illustrates, in a simplified cross-sectional view, an example air delivery control method at a stage of manufacture in accordance with an embodiment. At this stage of manufacture, with the cooling fixture 502 placed over the encapsulant 306 of the encapsulated assembly 402, the encapsulant 306 is cooled by way of an example programmed sequence. In this embodiment, the control system 600 is coupled with the cooling fixture 502 and programmed to cool the encapsulant 306 by sequencing the air exiting groups of nozzles. For example, a first group of nozzles 702 outputs air delivered from output OUT[1] during a first step (1) of the sequence, a second group of nozzles 704 outputs air delivered from output OUT[2] during a second step (2) of the sequence, a third group of nozzles 706 outputs air delivered from output OUT[3] during a third step (3) of the sequence, and a fourth group of nozzles 708 outputs air delivered from output OUT[4] during a fourth step (4) of the sequence. By cooling the encapsulated assembly 402 in a programmed sequence, portions of the encapsulant 306 are cooled subsequent to the cooling of other portions. The curing process is therefore controlled to achieve a desired planarity of the encapsulated assembly 402.

In this embodiment, each step of the sequence has a different start time. For example, the second step (2) of the sequence starts a predetermined time after the start of the first step (1), the third step (3) of the sequence starts a predetermined time after the start of the second step (2), and the fourth step (4) of the sequence starts a predetermined time after the start of the third step (1). In another example, the sequence may be programmed such that a prior step of the sequence completes before a subsequent step starts. In yet another example, the sequence may be programmed such that the duration of a prior step of the sequence overlaps the start of a subsequent step, and so on.

In some embodiments, the monitored sensor output signals MOUT may be used to adjust, terminate, and/or initiate steps of the sequence. For example, when the MOUT signals indicate that the temperature of a region of the encapsulant 306 reaches a predetermined threshold during a first step of a cooling sequence, the control system 600 may terminate the first step and start a second step of the sequence. In another example, the duration of a step of a cooling sequence may be extended by the control system 600 until the MOUT signals indicate that the temperature of a region of the encapsulant 306 reaches a predetermined threshold.

Figure 8:
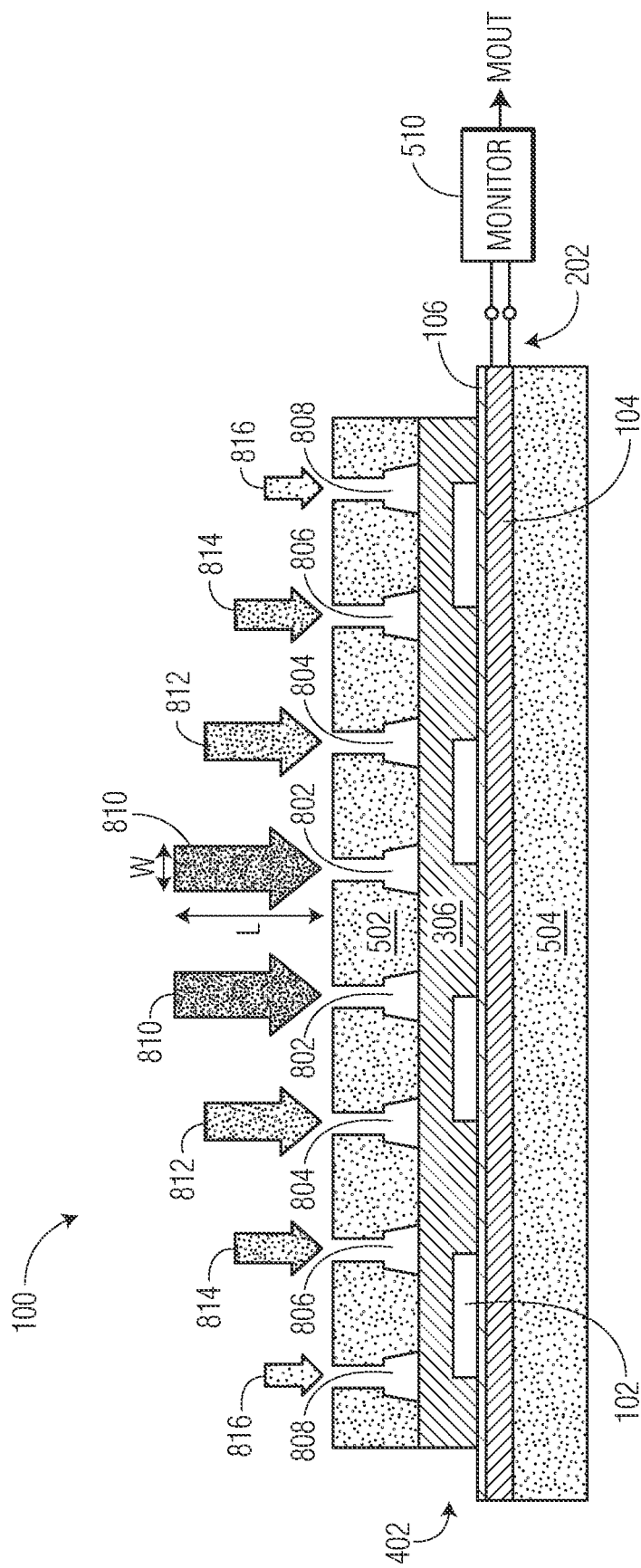

FIG. 8 illustrates, in a simplified cross-sectional view, an example air delivery control method at a stage of manufacture in accordance with an embodiment. At this stage of manufacture, with the cooling fixture 502 placed over the encapsulant 306 of the encapsulated assembly 402, the encapsulant 306 is cooled by way of example programmed air delivery. In this embodiment, the control system 600 is coupled with the cooling fixture 502 and programmed to cool the encapsulant 306 by controlling properties of the air exiting groups of nozzles. For example, the air delivery to the groups of nozzle has controlled properties such as air flow rate, air temperature, and duration.

In this example, arrows 810-816 depicted in FIG. 8 are illustrated having relative sizes (e.g., W, L) and shading representative of the air delivery from the control system 600 outputs OUT[1:4]. For example, an arrow width W provides a relative indication of an amount of air flow (e.g., wider arrow width indicates higher air flow) and an arrow length L provides a relative indication of a duration of the air flow (e.g., longer arrow indicates longer duration). The fill of each arrow provides a relative indication of the temperature of the air flow (e.g., denser/darker fill indicates cooler temperature).

In the example depicted in FIG. 8, a first group of nozzles 802 outputs air delivered from output OUT[1] having relative air flow indicated by arrows 810, a second group of nozzles 804 outputs air delivered from output OUT[2] having relative air flow indicated by arrows 812, a third group of nozzles 806 outputs air delivered from output OUT[3] having relative air flow indicated by arrows 814, and a fourth group of nozzles 808 outputs air delivered from output OUT[4] having relative air flow indicated by arrows 816. By cooling the encapsulated assembly 402 in a programmed air delivery manner, portions of the encapsulant 306 are cooled with air having properties different from those of air which cooled other portions of the encapsulant. The curing process is therefore controlled to achieve a desired planarity of the encapsulated assembly 402.

In some embodiments, the programmed air delivery to the groups of nozzles 802-808 having controlled properties (e.g., air flow rate, air temperature, duration) may further include a sequence of the air delivery to the groups of nozzles 802-808. For example, air delivered from output OUT[1] may occur during a first step of the sequence, air delivered from output OUT[2] may occur during a second step of the sequence, air delivered from output OUT[3] may occur during a third step of the sequence, and air delivered from output OUT[4] may occur during a fourth step of the sequence.

In some embodiments, the monitored sensor output signals MOUT may be used to adjust properties of the air delivered to the groups of nozzles. For example, the MOUT signals may be used to determine a rate at which a region of the encapsulant 306 is cooled and in response, adjust the temperature and/or air flow of air delivered to the group of nozzles proximate to that region.

Figure 9:
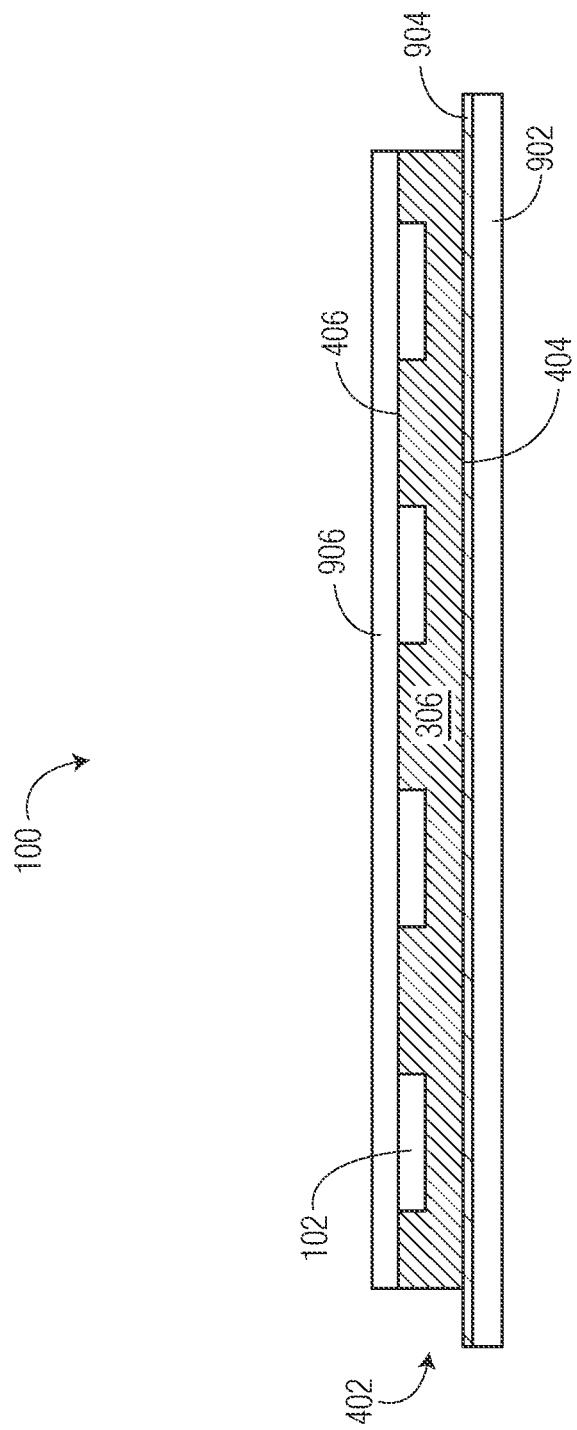
FIG. 9 and FIG. 10 illustrate, in simplified cross-sectional views, the example semiconductor device packaging at subsequent stages of manufacture in accordance with an embodiment.

FIG. 9 illustrates, in a simplified cross-sectional view, the example semiconductor device packaging 100 at a subsequent stage of manufacture in accordance with an embodiment. At this stage of manufacture, a processing layer 906 is formed over the active surface 406 of the encapsulated assembly 402. After the encapsulated assembly 402 is cooled in a manner depicted in FIG. 7 or FIG. 8 to achieve a desired flattened condition, for example, the carrier substrate 104 is removed. In this embodiment, the non-active surface 404 is mounted on a processing carrier 902 by way of an adhesive 904 such that the exposed active surface 406 may be subjected to planar-sensitive processing steps to form the processing layer 906. In some embodiments, the exposed active surface 406 of the encapsulated assembly 402 may be subjected to planar-sensitive processing steps to form the processing layer 906 without using a processing carrier. In this embodiment, the processing layer 906 may be characterized as a redistribution layer (RDL) formed over the active surface of the semiconductor die 102 and portions of the encapsulant 306. For example, the processing layer 906 may be formed as a series of patterned layers including a conductive layer sandwiched between a first non-conductive layer and a second non-conductive layer.

Figure 10:
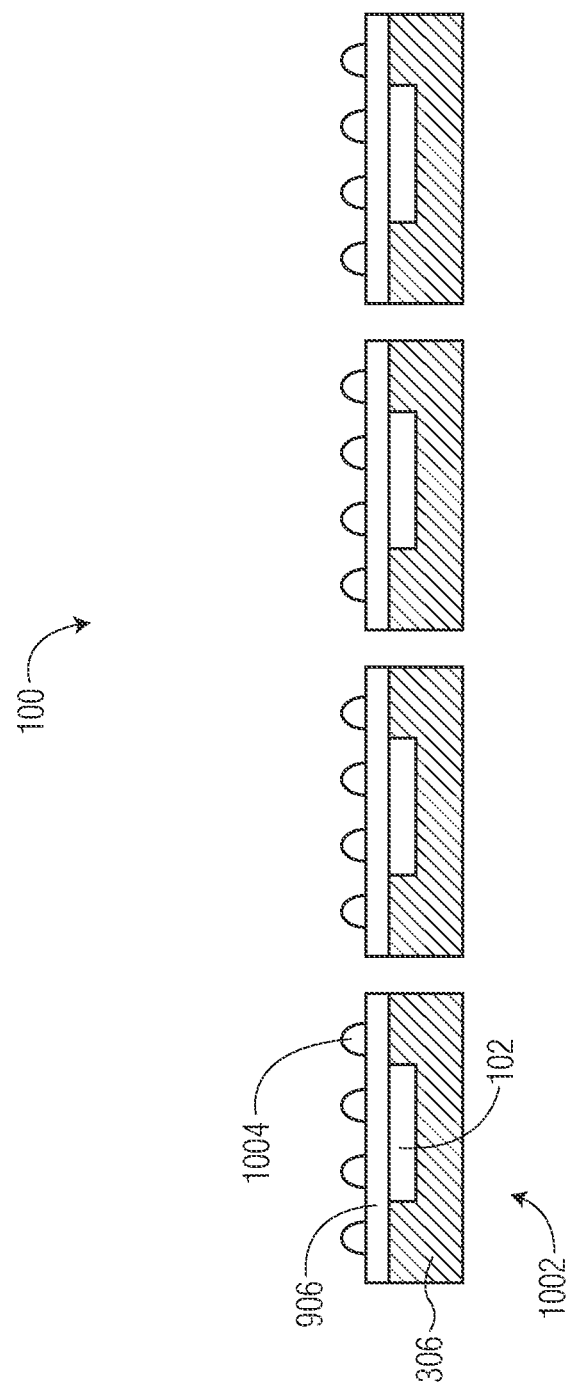

FIG. 10 illustrates, in a simplified cross-sectional view, the example semiconductor device packaging 100 at a subsequent stage of manufacture in accordance with an embodiment. At this stage of manufacture, the encapsulated assembly 402 is singulated into individual semiconductor device packaged units 1002. In this embodiment, the individual semiconductor device packaged units 1002 include conductive connectors 1004 (e.g., solder balls, gold studs, and the like) interconnected to the semiconductor die 102 by way of the processing layer 906 (e.g., RDL). The encapsulated assembly 402 may be singulated using known methods and techniques such as mechanical sawing, laser cutting, and combinations thereof.

Generally, there is provided, a method of manufacturing a packaged semiconductor device including placing a plurality of semiconductor die on a first side of a carrier substrate; encapsulating with an encapsulant the plurality of semiconductor die and an exposed portion of the first side of the carrier substrate; placing a cooling fixture over the encapsulant, the cooling fixture including a plurality of nozzles; and cooling the encapsulant by way of air exiting the plurality of nozzles, wherein an air flow rate, air temperature, or duration of air exiting a first nozzle of the plurality of nozzles is different from that of a second nozzle of the plurality of nozzles. The first nozzle of the plurality of nozzles may be configured for cooling a first region of the encapsulant and the second nozzle of the plurality of nozzles may be configured for cooling a second region of the encapsulant different from the first region. The air exiting the first nozzle of the plurality of nozzles may occur during a first step of a predetermined sequence and the air exiting the second nozzle of the plurality of nozzles may occur during a second step of the predetermined sequence, the second step different from the first step. The method may further include controlling by way of a controller unit the air flow rate, air temperature, or duration of the air exiting the first and the second nozzles of the plurality of nozzles. Placing the cooling fixture over the encapsulant may include clamping the cooling fixture onto the encapsulant such that the encapsulant is substantially flattened during the cooling the encapsulant step. The method may further include after cooling the encapsulant, removing the carrier substrate and forming a planar-sensitive layer over an active side of the plurality of semiconductor die. The carrier substrate may include a sensor coupled to an external monitor unit, the monitor unit configured to provide an output signal. The method may further include adjusting the air flow rate, air temperature, or duration of air exiting the first or the second nozzles of the plurality of nozzles based on the output signal. The sensor may be characterized as a strain gauge sensor or a temperature sensor.

In another embodiment, there is provided, a method of manufacturing a packaged semiconductor device including placing a plurality of semiconductor die on a first side of a carrier substrate; encapsulating with an encapsulant the plurality of semiconductor die and an exposed portion of the first side of the carrier substrate; placing a cooling fixture over the encapsulant, the cooling fixture including a plurality of nozzles; cooling a first region of the encapsulant by way of air exiting a first nozzle of the plurality of nozzles; and cooling a second region of the encapsulant by way of air exiting a second nozzle of the plurality of nozzles, wherein a property of the air exiting the first nozzle is different from that of the second nozzle. The method may further include controlling by way of a controller unit the property of the air exiting the first nozzle and the second nozzle. The method may further include adjusting the property of the air exiting the first nozzle or the second nozzle based on an output signal of a sensor integrated with the carrier substrate. Placing the cooling fixture over the encapsulant may include clamping the cooling fixture onto the encapsulant such that the encapsulant is substantially flattened during the steps of cooling the first region of the encapsulant and cooling the second region of the encapsulant. The method may further include after cooling the first region and the second region of the encapsulant, removing the carrier substrate and forming a planar-sensitive layer over an active side of the plurality of semiconductor die. The air exiting the first nozzle may occur during a first step of a predetermined sequence and the air exiting the second nozzle may occur during a second step of the predetermined sequence, the second step different from the first step. The property may be characterized as air flow rate, air temperature, or duration of the air exiting the first nozzle and the second nozzle.

In yet another embodiment, there is provided, an apparatus for manufacturing a packaged semiconductor device including a cooling fixture including a plurality of nozzles, the cooling fixture configured to: cool a first region of an encapsulant by way of a fluid exiting a first nozzle of the plurality of nozzles, the encapsulant encapsulating a plurality of semiconductor die placed on a carrier substrate; and cool a second region of the encapsulant by way of the fluid exiting a second nozzle of the plurality of nozzles, wherein a property of the fluid exiting the first nozzle is different from that of the second nozzle. The apparatus may further include a controller unit coupled to the cooling fixture, the controller unit configured to control the property of the fluid exiting the first nozzle and the second nozzle. The controller unit may be further configured to adjust the property of the fluid exiting the first nozzle or the second nozzle based on an output signal of a sensor integrated with the carrier substrate. The fluid may be characterized as air and the property may be characterized as air flow rate, air temperature, or duration of the air exiting the first nozzle and the second nozzle.

By now, it should be appreciated that there has been provided a semiconductor device packaging apparatus for controlling warpage. A cooling fixture includes a plurality of nozzles configured to systematically cool an encapsulated semiconductor device assembly. A control unit coupled to the cooling fixture controls properties such as fluid flow rate, fluid temperature, and duration of fluid exiting the nozzles. The fluid exiting the nozzles may be controlled for each individual nozzle or for predetermined groups of nozzles. A desired flatness of the encapsulated assembly is achieved by way of the cooling fixture and controlled fluid delivery process. With the desired flatness, subsequent planar-sensitive processing layers may be applied allowing for improved yield, reliability, costs, and handling through processing.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of controlling warpage of a packaged semiconductor device, the method comprising:
   placing a plurality of semiconductor die on a first side of a carrier substrate;
   encapsulating with an encapsulant the plurality of semiconductor die and an exposed portion of the first side of the carrier substrate;
   placing a cooling fixture over the encapsulant, the cooling fixture including two or more groups of nozzles, wherein each nozzle of the two or more groups of nozzles is fixed, and wherein each group of nozzles of the two or more groups of nozzles is associated with a respective region of the encapsulant; and
   directly cooling the encapsulant by way of air exiting the two or more groups of nozzles, wherein an air flow rate, air temperature, or duration of air exiting a first group of nozzles of the two or more groups of nozzles is different from that of a second group of nozzles of the two or more groups of nozzles, wherein
   the air exiting the first group of nozzles of the two or more groups of nozzles occurs during a first step of a predetermined sequence; and
   a duration of the first step is based on a temperature of at least a portion of the encapsulant.

2. The method of claim 1, wherein the first group of nozzles of the two or more groups of nozzles is configured for cooling a first region of the encapsulant and the second group of nozzles of the two or more groups of nozzles is configured for cooling a second region of the encapsulant different from the first region.

3. The method of claim 1, wherein the air exiting the second group of nozzles of the two or more groups of nozzles occurs during a second step of the predetermined sequence, the second step different from the first step.

4. The method of claim 1, further comprising controlling by way of a controller unit the air flow rate, air temperature, or duration of the air exiting the first and the second groups of nozzles of the two or more groups of nozzles.

5. The method of claim 1, wherein placing the cooling fixture over the encapsulant includes clamping the cooling fixture onto the encapsulant such that the encapsulant is substantially flattened during the cooling.

6. The method of claim 1, further comprising after cooling the encapsulant, removing the carrier substrate and forming a planar-sensitive layer over an active side of the plurality of semiconductor die.

7. The method of claim 1, wherein the carrier substrate includes a sensor coupled to an external monitor unit, the monitor unit configured to provide an output signal.

8. The method of claim 7, further comprising adjusting the air flow rate, air temperature, or duration of air exiting the first group or the second group of nozzles of the two or more groups of nozzles based on the output signal.

9. The method of claim 7, wherein the sensor is characterized as a strain gauge sensor or a temperature sensor.

10. A method of controlling warpage of a packaged semiconductor device, the method comprising:
    placing a plurality of semiconductor die on a first side of a carrier substrate;
    encapsulating with an encapsulant the plurality of semiconductor die and an exposed portion of the first side of the carrier substrate;
    placing a cooling fixture over the encapsulant, the cooling fixture including two or more groups of nozzles, wherein each nozzle of the two or more groups of nozzles is fixed, and wherein each group of nozzles of the two or more groups of nozzles is associated with a respective region of the encapsulant;
    directly cooling a first region of the encapsulant by way of air exiting a first group of nozzles of the two or more groups of nozzles; and
    directly cooling a second region of the encapsulant by way of air exiting a second group of nozzles of the two or more groups of nozzles, wherein a property of the air exiting the first group of nozzles is different from that of the second group of nozzles
    wherein:
    the air exiting the first group of nozzles of the two or more groups of nozzles occurs during a first step of a predetermined sequence; and
    a duration of the first step is based on a temperature of at least a portion of the encapsulant.

11. The method of claim 10, further comprising controlling by way of a controller unit the property of the air exiting the first group of nozzles and the second group of nozzles.

12. The method of claim 10, further comprising adjusting the property of the air exiting the first group of nozzles or the second group of nozzles based on an output signal of a sensor integrated with the carrier substrate.

13. The method of claim 10, wherein placing the cooling fixture over the encapsulant includes clamping the cooling fixture onto the encapsulant such that the encapsulant is substantially flattened during the steps of cooling the first region of the encapsulant and cooling the second region of the encapsulant.

14. The method of claim 10, further comprising after cooling the first region and the second region of the encapsulant, removing the carrier substrate and forming a planar-sensitive layer over an active side of the plurality of semiconductor die.

15. The method of claim 10, wherein the air exiting the second group of nozzles occurs during a second step of the predetermined sequence, the second step different from the first step.

16. The method of claim 10, wherein the property is characterized as air flow rate, air temperature, or duration of the air exiting the first group of nozzles and the second group of nozzles.

* * * * *